US 9,236,266 B2
Jan. 12, 2016

(12) United States Patent
Zhang et al.

(10) Patent No.: US 9,236,266 B2
(45) Date of Patent: Jan. 12, 2016

(54) DRY-ETCH FOR SILICON-AND-CARBON-CONTAINING FILMS

(71) Applicant: Applied Materials, Inc., Santa Clara, CA (US)

(72) Inventors: Jingchun Zhang, Cupertino, CA (US); Anchuan Wang, San Jose, CA (US); Nitin K. Ingle, San Jose, CA (US); Yunyu Wang, San Jose, CA (US); Young Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/287,850

(22) Filed: May 27, 2014

(65) Prior Publication Data

US 2014/0273491 A1 Sep. 18, 2014

Related U.S. Application Data

(63) Continuation of application No. 13/279,998, filed on Oct. 24, 2011, now Pat. No. 8,771,536.

(60) Provisional application No. 61/513,892, filed on Aug. 1, 2011.

(51) Int. Cl.
*H01L 21/3065* (2006.01)
*H01L 21/311* (2006.01)

(52) U.S. Cl.
CPC ...... *H01L 21/3065* (2013.01); *H01L 21/31116* (2013.01)

(58) Field of Classification Search
None
See application file for complete search history.

(56) References Cited

U.S. PATENT DOCUMENTS 2,369,620 A 2/1945 Sullivan et al.
3,451,840 A 6/1969 Hough
(Continued)

FOREIGN PATENT DOCUMENTS

CN 1375575 10/2002
CN 1412861 A 4/2003
(Continued)

OTHER PUBLICATIONS

Cho, T.S., "Dual Discharge Modes Operation of an Argon Plasma Generated by Commercial Electronic Ballast for Remote Plasma Removal Process," IEEE Transactions on Plasma Science, vol. 42, No. 6, , Jun. 2014, 4 pages.

(Continued)

*Primary Examiner* — Allan Olsen
(74) *Attorney, Agent, or Firm* — Kilpatrick Townsend & Stockton LLP

(57) ABSTRACT

A method of etching exposed silicon-and-carbon-containing material on patterned heterogeneous structures is described and includes a remote plasma etch formed from a fluorine-containing precursor and an oxygen-containing precursor. Plasma effluents from the remote plasma are flowed into a substrate processing region where the plasma effluents react with the exposed regions of silicon-and-carbon-containing material. The plasmas effluents react with the patterned heterogeneous structures to selectively remove silicon-and-carbon-containing material from the exposed silicon-and-carbon-containing material regions while very slowly removing other exposed materials. The silicon-and-carbon-containing material selectivity results partly from the presence of an ion suppression element positioned between the remote plasma and the substrate processing region. The ion suppression element reduces or substantially eliminates the number of ionically-charged species that reach the substrate. The methods may be used to selectively remove silicon-and-carbon-containing material at more than twenty times the rate of silicon oxide.

20 Claims, 4 Drawing Sheets

(56) References Cited

U.S. PATENT DOCUMENTS

| | | |
|---|---|---|
| 3,937,857 A | 2/1976 | Brummett et al. |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,625,678 A | 12/1986 | Shloya et al. |
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,851,370 A | 7/1989 | Doklan et al. |
| 4,865,685 A | 9/1989 | Palmour |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Loewenstein et al. |
| 4,913,929 A | 4/1990 | Moslehi et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,992,136 A | 2/1991 | Tachi et al. |
| 4,994,404 A | 2/1991 | Sheng et al. |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,186,718 A | 2/1993 | Tepman et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,316,804 A | 5/1994 | Tomikawa et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,599,740 A | 2/1997 | Jang et al. |
| 5,624,582 A | 4/1997 | Cain |
| 5,626,922 A | 5/1997 | Miyanaga et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,679,606 A | 10/1997 | Wang et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |

(56) References Cited

U.S. PATENT DOCUMENTS

| | | |
|---|---|---|
| 5,838,055 A | 11/1998 | Kleinhenz et al. |
| 5,843,538 A | 12/1998 | Ehrsam et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,812 B1 | 1/2001 | Hsuing et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,418 B1 | 10/2001 | Cha et al. |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| 6,344,410 B1 | 2/2002 | Lopatin et al. |
| 6,350,320 B1 | 2/2002 | Sherstinsky et al. |
| 6,351,013 B1 | 2/2002 | Luning et al. |
| 6,352,081 B1 | 3/2002 | Lu et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,379,575 B1 | 4/2002 | Yin et al. |
| 6,383,951 B1 | 5/2002 | Li |

(56) References Cited

U.S. PATENT DOCUMENTS

| | | |
|---|---|---|
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,416,647 B1 | 7/2002 | Dordi et al. |
| 6,427,623 B2 | 8/2002 | Ko |
| 6,432,819 B1 | 8/2002 | Pavate et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,586,163 B1 | 7/2003 | Okabe et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,852,550 B2 | 2/2005 | Tuttle et al. |
| 6,858,153 B2 | 2/2005 | Bjorkman et al. |
| 6,867,141 B2 | 3/2005 | Jung et al. |
| 6,869,880 B2 | 3/2005 | Krishnaraj et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,235,137 B2 | 6/2007 | Kitayama et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,365,016 B2 | 4/2008 | Ouellet et al. |
| 7,390,710 B2 | 6/2008 | Derderian et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,575,007 B2 | 8/2009 | Tang et al. |
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,083,853 B2 | 12/2011 | Choi et al. |
| 8,133,349 B1 | 3/2012 | Panagopoulos |
| 8,187,486 B1 | 5/2012 | Liu et al. |
| 8,211,808 B2 | 7/2012 | Sapre et al. |

(56) References Cited

U.S. PATENT DOCUMENTS

| | | |
|---|---|---|
| 8,309,440 B2 | 11/2012 | Sanchez et al. |
| 8,328,939 B2 | 12/2012 | Choi et al. |
| 8,435,902 B2 | 5/2013 | Tang et al. |
| 8,491,805 B2 | 7/2013 | Kushibiki et al. |
| 8,642,481 B2 | 2/2014 | Wang et al. |
| 8,771,536 B2 * | 7/2014 | Zhang et al. .................. 216/67 |
| 8,772,888 B2 | 7/2014 | Jung et al. |
| 8,956,980 B1 | 2/2015 | Chen et al. |
| 2001/0008803 A1 | 7/2001 | Takamatsu et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2001/0053585 A1 | 12/2001 | Kikuchi et al. |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0098681 A1 | 7/2002 | Hu et al. |
| 2002/0124867 A1 | 9/2002 | Kim et al. |
| 2002/0129769 A1 | 9/2002 | Kim et al. |
| 2002/0177322 A1 | 11/2002 | Li et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0003757 A1 | 1/2003 | Naltan et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0033678 A1 | 2/2004 | Arghavani et al. |
| 2004/0050328 A1 | 3/2004 | Kumagai et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0073051 A1 | 4/2005 | Yamamoto et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0214477 A1 | 9/2005 | Hanawa et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0266622 A1 | 12/2005 | Arghavani et al. |
| 2005/0266691 A1 | 12/2005 | Gu et al. |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0011298 A1 | 1/2006 | Lim et al. |
| 2006/0019456 A1 | 1/2006 | Bu et al. |
| 2006/0019486 A1 | 1/2006 | Yu et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0093756 A1 | 5/2006 | Rajagopalan et al. |
| 2006/0102076 A1 | 5/2006 | Smith et al. |
| 2006/0130971 A1 | 6/2006 | Chang et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0178008 A1 | 8/2006 | Yeh et al. |
| 2006/0185592 A1 | 8/2006 | Matsuura |
| 2006/0191637 A1 | 8/2006 | Zajac et al. |
| 2006/0207504 A1 | 9/2006 | Hasebe et al. |
| 2006/0210723 A1 | 9/2006 | Ishizaka |
| 2006/0211260 A1 | 9/2006 | Tran et al. |
| 2006/0216923 A1 | 9/2006 | Tran et al. |
| 2006/0226121 A1 | 10/2006 | Aoi |
| 2006/0240661 A1 | 10/2006 | Annapragada et al. |
| 2006/0246717 A1 | 11/2006 | Wang |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0261490 A1 | 11/2006 | Su et al. |
| 2006/0264003 A1 | 11/2006 | Eun |
| 2006/0264043 A1 | 11/2006 | Stewart et al. |

(56) References Cited

U.S. PATENT DOCUMENTS

| | | |
|---|---|---|
| 2006/0266288 A1 | 11/2006 | Choi |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0123051 A1 | 5/2007 | Arghavani et al. |
| 2007/0163440 A1 | 7/2007 | Kim et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0232071 A1 | 10/2007 | Balseanu et al. |
| 2007/0238321 A1 | 10/2007 | Futase et al. |
| 2007/0243685 A1 | 10/2007 | Jiang et al. |
| 2007/0269976 A1 | 11/2007 | Futase et al. |
| 2007/0281106 A1 | 12/2007 | Lubomirsky et al. |
| 2008/0044990 A1 | 2/2008 | Lee |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099431 A1 | 5/2008 | Kumar et al. |
| 2008/0115726 A1 | 5/2008 | Ingle et al. |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0142831 A1 | 6/2008 | Hua et al. |
| 2008/0153306 A1 | 6/2008 | Cho et al. |
| 2008/0160210 A1 | 7/2008 | Yang et al. |
| 2008/0162781 A1 | 7/2008 | Haller et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2009/0004849 A1 | 1/2009 | Eun |
| 2009/0017227 A1 | 1/2009 | Fu et al. |
| 2009/0045167 A1 | 2/2009 | Maruyama |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0170221 A1 | 7/2009 | Jacques et al. |
| 2009/0189246 A1 | 7/2009 | Wu et al. |
| 2009/0202721 A1 | 8/2009 | Nogami et al. |
| 2009/0255902 A1 | 10/2009 | Satoh et al. |
| 2009/0275205 A1 | 11/2009 | Kiehlbauch et al. |
| 2009/0275206 A1 | 11/2009 | Katz et al. |
| 2009/0277874 A1 | 11/2009 | Rui et al. |
| 2009/0280650 A1 | 11/2009 | Lubomirsky et al. |
| 2010/0048027 A1 | 2/2010 | Cheng et al. |
| 2010/0055917 A1 | 3/2010 | Kim |
| 2010/0059889 A1 | 3/2010 | Gosset et al. |
| 2010/0075503 A1 | 3/2010 | Bencher et al. |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0144140 A1 | 6/2010 | Chandrashekar et al. |
| 2010/0173499 A1 | 7/2010 | Tao et al. |
| 2010/0178755 A1 | 7/2010 | Lee et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0207205 A1 | 8/2010 | Grebs et al. |
| 2010/0330814 A1 | 12/2010 | Yokota et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0053380 A1 | 3/2011 | Sapre et al. |
| 2011/0081782 A1 | 4/2011 | Liang et al. |
| 2011/0124144 A1 | 5/2011 | Schlemm et al. |
| 2011/0143542 A1 | 6/2011 | Feurprier et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0003782 A1 | 1/2012 | Byun et al. |
| 2012/0009796 A1 | 1/2012 | Cui et al. |
| 2012/0068242 A1 | 3/2012 | Shin et al. |
| 2012/0135576 A1 | 5/2012 | Lee et al. |
| 2012/0164839 A1 | 6/2012 | Nishimura |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0005140 A1 | 1/2013 | Jeng et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0089988 A1 | 4/2013 | Wang et al. |
| 2013/0119483 A1 | 5/2013 | Alptekin et al. |
| 2013/0187220 A1 | 7/2013 | Surthi |
| 2013/0260533 A1 | 10/2013 | Sapre et al. |
| 2013/0284369 A1 | 10/2013 | Kobayashi et al. |
| 2013/0284370 A1 | 10/2013 | Kobayashi et al. |
| 2013/0302980 A1 | 11/2013 | Chandrashekar et al. |
| 2014/0263272 A1 | 9/2014 | Duan et al. |

FOREIGN PATENT DOCUMENTS

| | | |
|---|---|---|
| CN | 101465386 A | 6/2009 |
| EP | 0329406 | 8/1989 |
| EP | 0376252 A2 | 7/1990 |
| EP | 0475567 | 3/1992 |
| EP | 0 496 543 A2 | 7/1992 |
| EP | 0 658 928 A1 | 6/1995 |
| EP | 0697467 A1 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |
| JP | 61-276977 A | 12/1986 |
| JP | 2058836 A | 2/1990 |
| JP | 02-121330 A | 5/1990 |
| JP | 02256235 | 10/1990 |
| JP | 4-239750 | 7/1992 |
| JP | 4-341568 A | 11/1992 |
| JP | 07-130713 A | 5/1995 |
| JP | 7-161703 A | 6/1995 |
| JP | 7297543 | 11/1995 |
| JP | 08-306671 A | 11/1996 |
| JP | 09153481 A | 6/1997 |
| JP | 09-205140 A | 8/1997 |
| JP | 10-178004 A | 6/1998 |
| JP | 2010-154699 | 6/1998 |
| JP | 11124682 | 5/1999 |

(56) References Cited

FOREIGN PATENT DOCUMENTS

| | | |
|---|---|---|
| JP | H11-204442 | 7/1999 |
| JP | 2000-012514 A | 1/2000 |
| JP | 2001-308023 | 11/2001 |
| JP | 2002-100578 | 4/2002 |
| JP | 2002-141349 | 5/2002 |
| JP | 2002-222861 A | 8/2002 |
| JP | 2003-019433 | 1/2003 |
| JP | 2003-059914 | 2/2003 |
| JP | 2003-179038 A | 6/2003 |
| JP | 2003-217898 | 7/2003 |
| JP | 2003-318158 A | 11/2003 |
| JP | 2003-347278 A | 12/2003 |
| JP | 2004-047956 A | 2/2004 |
| JP | 2004-156143 A | 6/2004 |
| JP | 04-239723 A | 8/2004 |
| JP | 2005-033023 A | 2/2005 |
| JP | 2007-173383 A | 7/2007 |
| JP | 08-148470 A | 6/2008 |
| JP | 2009-044129 A | 2/2009 |
| JP | 2009-044129 A | 2/2013 |
| KR | 10-0155601 B1 | 12/1998 |
| KR | 10-0236219 B1 | 12/1999 |
| KR | 1020000008278 A | 2/2000 |
| KR | 2000-0044928 | 7/2000 |
| KR | 2001-0014064 A | 2/2001 |
| KR | 10-2001-0049274 A | 6/2001 |
| KR | 10-2001-0058774 A | 7/2001 |
| KR | 10-2001-0082109 A | 8/2001 |
| KR | 10-2003-0054726 A | 7/2003 |
| KR | 1020030096140 | 12/2003 |
| KR | 10-2004-0049739 A | 6/2004 |
| KR | 10-2004-0096365 A | 11/2004 |
| KR | 1020050042701 A | 5/2005 |
| KR | 10-0681390 | 9/2006 |
| KR | 10-2008-0013174 A | 2/2008 |
| KR | 1020080063988 A | 7/2008 |
| KR | 10-2009-0080533 A | 7/2009 |
| KR | 10-2010-0013980 A | 2/2010 |
| KR | 10-2010-0074508 A | 7/2010 |
| KR | 10-2010-0075957 A | 7/2010 |
| KR | 10/2010/0083629 A | 7/2010 |
| KR | 10-2010-099535 A | 9/2010 |
| KR | 10-2011-0086540 A | 7/2011 |
| KR | 10-1050454 B1 | 7/2011 |
| KR | 1020110126675 A | 11/2011 |
| KR | 1020120082640 A | 7/2012 |
| WO | 92/20833 A1 | 11/1992 |
| WO | 99/26277 A1 | 5/1999 |
| WO | 99/54920 A2 | 10/1999 |
| WO | 99/62108 A2 | 12/1999 |
| WO | 00/13225 A1 | 3/2000 |
| WO | 00/22671 | 4/2000 |
| WO | 01/94719 A1 | 12/2001 |
| WO | 02083981 A2 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 A2 | 4/2005 |
| WO | 2006/069085 A2 | 6/2006 |
| WO | 2009/071627 A2 | 6/2009 |
| WO | 2011/087580 A1 | 7/2011 |
| WO | 2011/115761 A2 | 9/2011 |
| WO | 2011/139435 A2 | 11/2011 |
| WO | 2012/018449 A2 | 2/2012 |
| WO | 2012/125654 A2 | 9/2012 |

OTHER PUBLICATIONS

C.K. Hu, et al. "Reduced Electromigration of Cu Wires by Surface Coating" Applied Physics Letters, vol. 81, No. 10, Sep. 2, 2002—pp. 1782-1784.

European Search Report dated May 23, 2006 for EP Application No. 05251143.3.

European Examination Report dated Nov. 13, 2007 for EP Application No. 05251143.3.

EP Partial Search Report, Application No. 08150111.601235/1944796, dated Aug. 22, 2008.

Eze, F. C., "Electroless deposition of CoO thin films," J. Phys. D: Appl. Phys. 32 (1999), pp. 533-540.

Galiano et al. "Stress-Temperature Behavior of Oxide Films Used for Intermetal Dielectric Applications", VMIC Conference, Jun. 9-10, 1992, pp. 100-106.

Iijima, et al., "Highly Selective $SiO_2$ Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.

International Search Report of PCT/US2009/059743 mailed on Apr. 26, 2010, 4 pages.

International Search Report of PCT/US2012/061726 mailed on May 16, 2013, 3 pages.

International Search Report of PCT/2013/052039 mailed on Nov. 8, 2013, 9 pages.

International Search Report of PCT/2013/037202 mailed on Aug. 23, 2013, 11 pages.

Lin, et al., "Manufacturing of Cu Electroless Nickel/Sn—Pb Flip Chip Solder Bumps", IEEE Transactions on Advanced Packaging, vol. 22, No. 4 (Nov. 1999), pp. 575-579.

Lopatin, et al., "Thin Electroless barrier for copper films", Part of the SPIE Conference of Multilevel Interconnect technology II, SPIE vol. 3508 (1998), pp. 65-77.

Musaka, "Single Step Gap Filling Technology fo Subhalf Micron Metal Spacings on Plasma Enhanced $TEOS/O_2$ Chemical Vapor Deposition System," Extended Abstracts of the 1993 International Conference on Solid State Devices and Materials pages, 1993, 510-512.

Pearlstein, Fred. "Electroless Plating," J. Res. Natl. Bur. Stan., Ch. 31 (1974), pp. 710-747.

Saito, et al., "Electroless deposition of Ni—B, Co—B and Ni—Co—B alloys using dimethylamineborane as a reducing agent," Journal of Applied Electrochemistry 28 (1998), pp. 559-563.

Schacham-Diamond, et al., "Electrochemically deposited thin film alloys for ULSI and MEMS applications," Microelectronic Engineering 50 (2000), pp. 525-531.

Schacham-Diamond, et al. "Material properties of electroless 100-200 nm thick CoWP films," Electrochemical Society Proceedings, vol. 99-34, pp. 102-110.

Smayling, et al., "APF® Pitch-Halving for 2nm Logic Cells using Gridded Design Rules", proceedings of the SPIE, 2008, 8 pages.

Vassiliev, et al., "Trends in void-free pre-metal CVD dielectrics," Solid State Technology, Mar. 2001, pp. 129-136.

Weston, et al., "Ammonium Compounds," Kirk-Othmer Encyclopedia of Chemical Technology, 2003, 30 pages see pp. 717-718, John Wiley & Sons, Inc.

Yosi Shacham-Diamond, et al. "High Aspect Ratio Quarter-Micron Electroless Copper Integrated Technology", Microelectronic Engineering 37/38 (1997) pp. 77-88.

Abraham, "Reactive Facet Tapering of Plasma Oxide for Multilevel Interconnect Applications", IEEE, V-MIC Conference, Jun. 15-16, 1987, pp. 115-121.

Applied Materials, Inc., "Applied Siconi™ Preclean," printed on Aug. 7, 2009, 8 pages.

Carlson, et al., "A Negative Spacer Lithography Process for Sub-100nm Contact Holes and Vias", University of California at Berkeley, Jun. 19, 2007, 4 pp.

Chang et al. "Frequency Effects and Properties of Plasma Deposited Fluorinated Silicon Nitride", J. Vac Sci Technol B 6(2), Mar./Apr. 1988, pp. 524-532.

Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.

Examination Report dated Jun. 28, 2010 for European Patent Application No. 05251143.3. I.

Fukada et al., "Preparation of SiOF Films with Low Dielectric Constant by ECR Plasma CVD," ISMIC, DUMIC Conference, Feb. 21-22, 1995, pp. 43-49.

(56) References Cited

OTHER PUBLICATIONS

Hashim et al., "Characterization of thin oxide removal by RTA Treatment," ICSE 1998 Proc. Nov. 1998, Rangi, Malaysia, pp. 213-216.
Hausmann, et al., "Rapid Vapor Deposition of Highly Conformal Silica Nanolaminates," Science, Oct. 11, 2002, p. 402-406, vol. 298.
Hayasaka, N. et al. "High Quality Low Dielectric Constant SiO2 CVD Using High Density Plasma," Proceedings of the Dry Process Symposium, 1993, pp. 163-168.
Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.
International Search Report and Written Opinion of the International Searching Authority mailed Jul. 3, 2008 (PCT/US05/46226).
International Search Report and Written Opinion for PCT Application No. PCT/US2011/027221, mailed on Nov. 1, 2011, 8 pages.
International Search Report and Written Opinion of PCT/US2010/057676 mailed on Jun. 27, 2011, 9 pages.
International Search Report and Written Opinion of PCT/US2011/030582 mailed Dec. 7, 2011, 9 pages.
International Search Report and Written Opinion of PCT/US2011/064724 mailed on Oct. 12, 2012, 8 pages.
International Search Report and Written Opinion of PCT/US2012/028952 mailed on Oct. 29, 2012, 9 pages.
International Search Report and Written Opinion of PCT/US2012/048842 mailed on Nov. 28, 2012, 10 pages.
International Search Report and Written Opinion of PCT/US2012/053329 mailed on Feb. 15, 2013, 8 pages.
International Search Report and Written Opinion of PCT/US2012/057294 mailed on Mar. 18, 2013, 12 pages.
International Search Report and Written Opinion of PCT/US2012/057358 mailed on Mar. 25, 2013, 10 pages.
International Search Report and Written Opinion of PCT/US2012/058818 mailed on Apr. 1, 2013, 9 pages.
International Search Report and Written Opinion of the International Searching Authority for PCT Application No. PCT/US2012/028957, mailed on Oct. 18, 2012, 9 pages.
International Search report and Written Opinion of PCT/CN2010/000932 dated Mar. 31, 2011, 8 pages.
Japanese Patent Office, Official Action for Application No. 2007-317207 mailed on Dec. 21, 2011, 2 pages.
Jung, et al., "Patterning with amorphous carbon spacer for expanding the resolution limit of current lithography tool", Proc. SPIE, 2007, 9 pages, vol. 6520, 65201C.
Laxman, "Low ε Dielectrics: CVD Fluorinated Silicon Dioxides", Semiconductor International, May 1995, pp. 71-74.
Lee, et al., "Dielectric Planarization Techniques for Narrow Pitch Multilevel Interconnects," IEEE, V-MIC Conference Jun. 15-16, 1987, pp. 85-92 (1987).
Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.
Meeks, Ellen et al., "Modeling of $SiO_2$ deposition in high density plasma reactors and comparisons of model predictions with experimental measurements," J. Vac. Sci. Technol. A, Mar./Apr. 1998, pp. 544-563, vol. 16(2).
Mukai, et al., "A Study of CD Budget in Spacer Patterning Process", Toshiba, SPIE 2008, Feb. 26, 2008, 12 pages.
Nishino, et al.; Damage-Free Selective Etching of SI Native Oxides Using NH3/NF3 and SF6/H20 Down-Flow Etching, The Japanese Society of Applied Physics, vol. 74, No. 2, pp. 1345-1348, XP-002491959, Jul. 15, 1993.
Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.
Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.
Qian, et al., "High Density Plasma Deposition and Deep Submicron Gap Fill with Low Dielectric Constant SiOF Films," ISMIC, DUMIC Conference Feb. 21-22, 1995, 1995, pp. 50-56.
Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.
Shapiro, et al. "Dual Frequency Plasma CVD Fluorosilicate Glass: Water Absorption and Stability", ISMIC, DUMIC Conference Feb. 21-22, 1995, 1995. pp. 118-123.
S.M. Sze, VLSI Technology, McGraw-Hill Book Company, pp. 107, 108.
Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.
Wang et al.; Ultra High-selectivity silicon nitride etch process using an inductively coupled plasma source; J. Vac. Sci. Techno!. A 16(3),May/Jun. 1998, pp. 1582-1587.
Wolf et al.; Silicon Processing for the VLSI Era; vol. 1; 1986; Lattice Press, pp. 546, 547, 618, 619.
Yu, et al., "Step Coverage Study of Peteos Deposition for Intermetal Dielectric Applications," abstract, VMIC conference, Jun. 12-13, 1990, 7 pages, No. 82.
Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.
Abe et al., "Developments of plasma etching technology for fabricating semiconductor devices," Jpn. J. Appl. Phys., vol. 47, No. 3R, Mar. 2008, 21 pgs.
Cho et al., "Dual Discharge Modes Operation of an Argon Plasma Generated by Commercial Electronic Ballast for Remote Plasma Removal Process," IEEE Transactions on Plasma Science, vol. 42, No. 6, , Jun. 2014, 4 pages.
Cho et al., "Dielectric-barrier microdischarge structure for effic ient positive-column plasma using a thick-film ceramic sheet," IEEE Trans. Plasma Sci., vol. 37, No. 8, Aug. 2009, 4 pgs.
Cho et al., "Three-dimensional spatiotemporal behaviors of light emission from discharge plasma of alternating current plasma display panels," Appl. Phys. Lett. , vol. 92, No. 22, Jun. 2008, 3pgs.
Cho et al., "Analysis of address discharge modes by using a three-dimensional plasma display panel," IEEE Trans. Plasma Sci. , vol. 36, Oct. 2008, 4 pgs.
Formation of multilayer enscapulating film over substrate, e.g. displace device, comprising delivering mixture precursors and hydrogen gas into substrate processing system, 2006.
Goebels, F.J. et al. "Arbitrary Polarization from Annular Slot Planar Antennas." Ire Transactions on Antennas and Propagation, Jul. 1961, 8 pgs.
Kim et al., "Pendulum electrons in micro hollow cathode di scharges," IEEE Trans. Plasma Sci. , vol. 36, No. 4, pp. Aug. 2008, 2 pgs.
Redolfi et al., "Bulk FinFET fabrication with new approaches for oxide topography control using dry removal techniques," Solid-State Electron., vol. 71, May 2012, 7 pgs.
Schoenbach et al.,"High-pressure hollow cathode di scharges," Plasma Sources Sci. Te chnol.,vol. 6, No. 4, Nov. 1997, 10 pgs.
International Search Report and Written Opinion of PCT/US2013/076217 mailed on Apr. 28, 2014, 11 pages.
C.C. Tang and D. W. Hess, Tungsten Etching in CF4 and SF6 Discharges, J. Electrochem. Soc., 1984, 131 (1984) p. 115-120.
Yang, R., "Advanced in situ pre-Ni silicide (Siconi) cleaning at 65 nm to resolve defects in NiSix modules," J. Vac. Sci., Technol. B, Microelectron. Nanometer Struct., vol. 28, No. 1, Jan. 2010, 6 pgs.
Yasaka, Y. et al. "Planar microwave discharges with active control of plasma uniformity". Physics of Plasmas, vol. 9 No. 3, Mar. 2002, 7 pgs.
Yasuda et al., "Dual-function remote plasma etching/cleaning system applied to selective etching of Si02 and removal of polymeric residues," J. Vac. Sci. Technol., A, vol. 11, No. 5, 1993, 12 pgs.

\* cited by examiner

DRY-ETCH FOR SILICON-AND-CARBON-CONTAINING FILMS

CROSS-REFERENCES TO RELATED APPLICATIONS

This application is a continuation of U.S. patent application Ser. No. 13/279,998 by Zhang et al., filed Oct. 24, 2011 and titled "DRY-ETCH FOR SILICON-AND-CARBON-CONTAINING FILMS," which claims the benefit of U.S. Provisional Application No. 61/513,892 by Zhang et al., filed Aug. 1, 2011 and titled "DRY-ETCH FOR SILICON-AND-CARBON-CONTAINING FILMS," which are both herein incorporated by reference in their entirety for all purposes.

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials. However, there are few options for selectively etching silicon carbide.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Remote plasma etch processes have also been developed to remove silicon carbide, however, the silicon carbide selectivity of these etch processes (relative to silicon oxide) has been limited to less than twenty and often much less. Some of these remote plasma etch processes produce solid by-products which grow on the surface of the substrate as substrate material is removed. The solid by-products are subsequently removed via sublimation when the temperature of the substrate is raised. As a consequence of the production of solid by-products, Siconi™ etch process can deform delicate remaining structures formed in or nearby exposed regions of silicon carbide.

Alternative methods are needed to improve silicon carbide selectively relatively to silicon oxide and it is also desirable to remove silicon carbide without producing solid by-products.

BRIEF SUMMARY OF THE INVENTION

A method of etching exposed silicon-and-carbon-containing material on patterned heterogeneous structures is described and includes a remote plasma etch formed from a fluorine-containing precursor and an oxygen-containing precursor. Plasma effluents from the remote plasma are flowed into a substrate processing region where the plasma effluents react with the exposed regions of silicon-and-carbon-containing material. The plasma effluents react with the patterned heterogeneous structures to selectively remove silicon-and-carbon-containing material from the exposed silicon-and-carbon-containing material regions while very slowly removing other exposed materials. The silicon-and-carbon-containing material selectivity results partly from the presence of an ion suppression element positioned between the remote plasma and the substrate processing region. The ion suppression element reduces or substantially eliminates the number of ionically-charged species that reach the substrate. The methods may be used to selectively remove silicon-and-carbon-containing material at more than twenty times the rate of an exposed silicon oxide region.

Embodiments of the invention include methods of etching a patterned substrate in a substrate processing region of a substrate processing chamber. The patterned substrate has an exposed silicon-and-carbon-containing region. The methods include flowing each of a fluorine-containing precursor and an oxygen-containing precursor into a remote plasma region fluidly coupled to the substrate processing region while forming a plasma in the plasma region to produce plasma effluents. The methods further include etching the exposed silicon-and-carbon-containing region by flowing the plasma effluents into the substrate processing region.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

Figure 1:
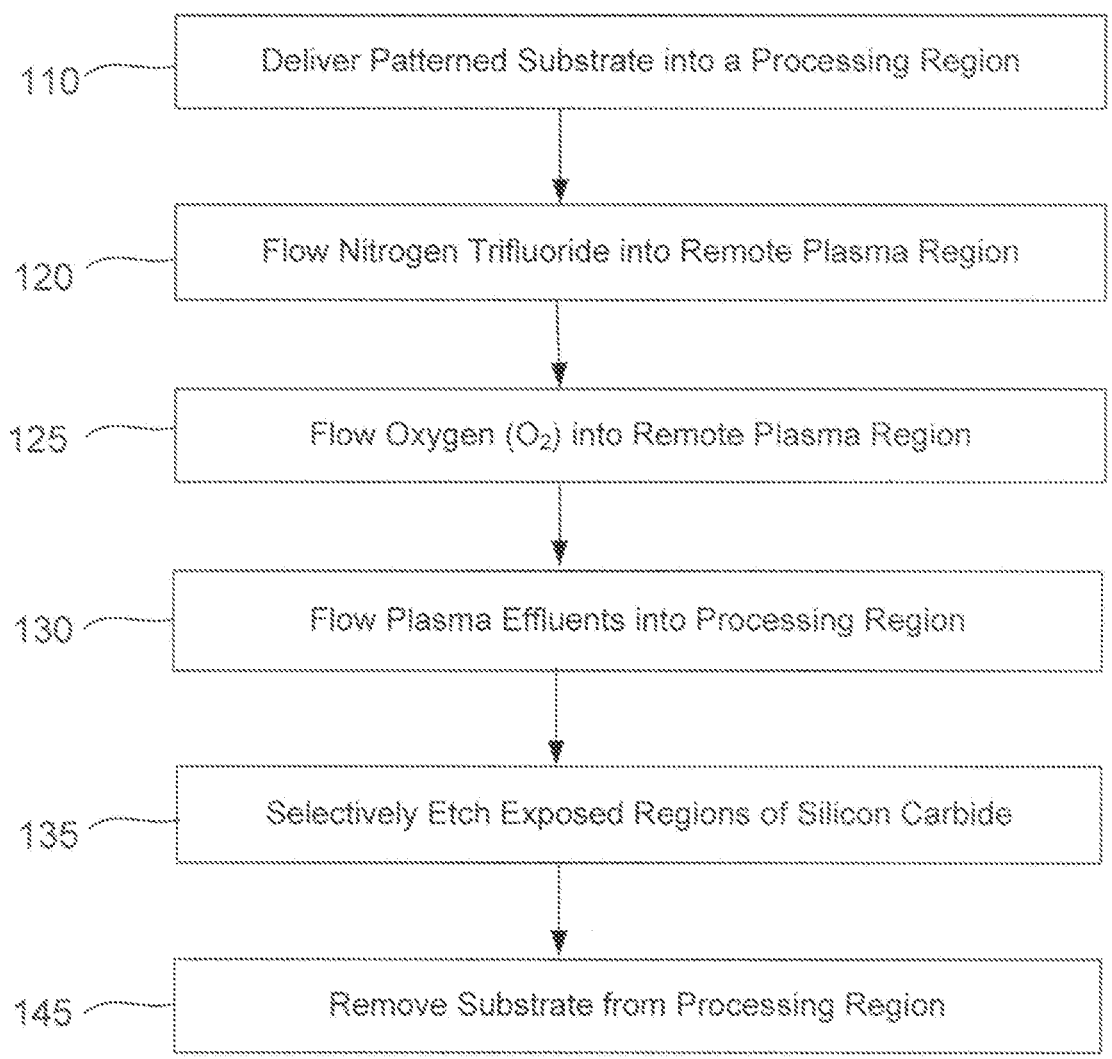
FIG. 1 is a flow chart of a silicon carbide selective etch process according to disclosed embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching exposed silicon-and-carbon-containing material on patterned heterogeneous structures is described and includes a remote plasma etch formed from a fluorine-containing precursor and an oxygen-containing precursor. Plasma effluents from the remote plasma are flowed into a substrate processing region where the plasma effluents react with the exposed regions of silicon-and-carbon-containing material. The plasmas effluents react with the patterned heterogeneous structures to selectively remove silicon-and-carbon-containing material from the exposed silicon-and-carbon-containing material regions while very slowly removing other exposed materials. The silicon-and-carbon-containing material selectivity results partly from the presence of an ion suppression element positioned between the remote plasma and the substrate processing region. The ion suppression element reduces or substantially eliminates the number of ionically-charged species that reach the substrate. The methods may be used to selectively remove silicon-and-carbon-containing material at more than twenty times the rate of an exposed silicon oxide region.

The ion suppression element functions to reduce or eliminate ionically charged species traveling from the plasma generation region to the substrate. Uncharged neutral and radical species may pass through the openings in the ion suppressor to react at the substrate. It should be noted that complete elimination of ionically charged species in the reaction region surrounding the substrate is not always the desired goal. In many instances, ionic species are required to reach the substrate in order to perform the etch and/or deposition process. In these instances, the ion suppressor helps control the concentration of ionic species in the reaction region at a level that assists the process.

In accordance with some embodiments of the invention, an ion suppressor as described in the exemplary equipment section may be used to provide radical and/or neutral species for selectively etching substrates. In one embodiment, for example, an ion suppressor is used to provide fluorine and oxygen containing plasma effluents to selectively etch silicon-and-carbon-containing material. Using the plasma effluents, an etch rate selectivity of silicon-and-carbon-containing material to silicon oxide of as high as about 4000:1 or more can be obtained. The ion suppressor may be used to provide a reactive gas having a higher concentration of radicals than ions. Because most of the charged particles of a plasma are filtered or removed by the ion suppressor, the substrate is typically not biased during the etch process. Such a process using radicals and other neutral species can reduce plasma damage compared to conventional plasma etch processes that include sputtering and bombardment. Embodiments of the present invention are also advantageous over conventional wet etch processes where surface tension of liquids can cause bending and peeling of small features.

In order to better understand and appreciate the invention, reference is now made to FIG. 1 which is a flow chart of a silicon carbide selective etch process according to disclosed embodiments. Silicon carbide is an example of a silicon-and-carbon-containing material. Prior to the first operation, a structure is formed in a patterned substrate. The structure possesses separate exposed regions of silicon carbide and silicon oxide. The substrate is then delivered into a processing region (operation 110).

A flow of nitrogen trifluoride is introduced into a plasma region separate from the processing region (operation 120). Other sources of fluorine may be used to augment or replace the nitrogen trifluoride. In general, a fluorine-containing precursor may be flowed into the plasma region and the fluorine-containing precursor comprises at least one precursor selected from the group consisting of atomic fluorine, diatomic fluorine, bromine trifluoride, chlorine trifluoride, nitrogen trifluoride, hydrogen fluoride, sulfur hexafluoride and xenon difluoride. Even carbon containing precursors, such as carbon tetrafluoride, trifluoromethane, difluoromethane, fluoromethane and the like, can be added to the group already listed. The use of carbon-containing precursor generally requires an increased flow of the oxygen-containing precursors described herein. The separate plasma region may be referred to as a remote plasma region herein and may be within a distinct module from the processing chamber or a compartment within the processing chamber. Oxygen ($O_2$) is also flowed into the plasma region (operation 125) where it is simultaneously excited in a plasma along with the nitrogen trifluoride. Generally speaking, an oxygen-containing precursor may be flowed into the plasma region and the oxygen-containing precursor may comprise at least one precursor selected from $O_2$, $O_3$, $N_2O$, NO, $NO_2$, or the like.

Embodiments of the invention maintain a high atomic flow ratio of oxygen (O) to fluorine (F) in order achieve an etch rate of silicon-and-carbon-containing films which lends itself to use in manufacturing. Essentially the presence of oxygen helps to scavenge carbon from the silicon-and-carbon-containing film. In one embodiment, a gas flow ratio ($O_2$:$NF_3$) of between 1:1 and 4:1, or more generally an atomic flow ratio of between 2:3 and 8:3 (O:F), was found to achieve manufacturable etch rates of 50-100 Å/minute or more. The present invention may also utilize O:F ratios at or above or about 0.5:1, above or about 1:1 or above or about 2:1 in different embodiments. The O:F atomic flow ratios may be below or about 10:1, below or about 6:1, below or about 5:1 or below or about 4:1 in embodiments of the invention. Upper limits on the atomic flow ratio may be combined with lower limits to create other embodiments. The higher ranges are typically used for fluorine-containing precursors which contain carbon. The more general atomic flow ratio, O:F, is calculated from the gas flow rate of each precursor gas and the total number of each atom per molecule. In the embodiment wherein one precursor is $O_2$ and another is $NF_3$, each molecule of oxygen includes two oxygen atoms whereas each molecule of nitrogen trifluoride includes three fluorine atoms. Using mass flow controllers to maintain a gas flow ratio above, e.g. 1:1, will result in an atomic flow ratio of above 2:3. In another embodiment, the precursor gases include at least one gas which contains both oxygen and fluorine. The atomic flow rate of all contributions are included when calculating the atomic flow ratio.

The plasma effluents formed in the remote plasma region are then flowed into the substrate processing region (operation 130). The patterned substrate is selectively etched (operation 135) such that the exposed silicon carbide is removed at a rate at least twenty times greater than the exposed silicon oxide. The reactive chemical species are removed from the substrate processing region and then the substrate is removed from the processing region (operation 145). The flow of oxygen ($O_2$) into the plasma and resulting flow of oxygen-containing excited species into the substrate processing region enables the fluorine-containing excited species in the plasma effluents to remove the silicon carbide. The flow of oxygen-containing excited species into the substrate processing region has little effect on the exposed regions of silicon oxide so the fluorine-containing excited species are substantially unable to etch the silicon oxide regions.

Using the oxygen-containing precursor increases the etch rate of the silicon carbide with minimal impact on an etch rate of the silicon oxide. The fluorine-containing precursor and/or the oxygen-containing precursor may further include one or more relatively inert gases such as He, $N_2$, Ar, or the like. The inert gas can be used to improve plasma stability. Flow rates and ratios of the different gases may be used to control etch rates and etch selectivity. In an embodiment, the fluorine-containing gas includes $NF_3$ at a flow rate of between about 5 sccm and 300 sccm, $O_2$ at a flow rate of between about 0 sccm and 1500 sccm, He at a flow rate of between about 0 sccm and 3000 sccm, and Ar at a flow rate of between about 0 sccm and 3000 sccm. One of ordinary skill in the art would recognize that other gases and/or flows may be used depending on a number of factors including processing chamber configuration, substrate size, geometry and layout of features being etched, and the like. Some hydrogen-containing precursors may also be combined with the other precursors or flowed separately into the plasma region, however, the concentration should be kept low. Hydrogen may interact with the fluorine-containing precursor in the plasma to form precursors which remove silicon oxide by forming solid residue by-products on the oxide surface. This reaction reduces the selectivity of the exposed silicon carbide regions as compared with exposed silicon oxide regions. Though some hydrogen may be useful to introduce in some embodiments, there may also be no or essentially no flow of hydrogen-containing precursors into the plasma region during the etch process in other embodiments.

The method also includes applying energy to the fluorine-containing precursor and the oxygen-containing precursor while they are in the remote plasma region to generate the plasma effluents. As would be appreciated by one of ordinary skill in the art, the plasma may include a number of charged and neutral species including radicals and ions. The plasma may be generated using known techniques (e.g., RF, capacitively coupled, inductively coupled, and the like). In an embodiment, the energy is applied using a capacitively-coupled plasma unit at a source power of between about 10 W and 2000 W and a pressure of between about 0.2 Torr and 30 Torr. The capacitively-coupled plasma unit may be disposed remote from a gas reaction region of the processing chamber. For example, the capacitively-coupled plasma unit and the plasma generation region may be separated from the gas reaction region by an ion suppressor.

Without wishing to bind the coverage of the claims to theoretical mechanisms which may or may not be entirely correct, some discussion of possible mechanisms may prove beneficial. Radical-fluorine precursors and radical-oxygen precursors are concurrently produced by delivering a fluorine-containing precursor and an oxygen-containing precursor into the remote plasma region. Applicants suppose that a concentration of radical-fluorine fragments, fluorine ions and atoms are produced and delivered into the substrate processing region. Applicants further suppose that radical-oxygen species are concurrently delivered to the substrate processing region. The radical-oxygen species may react with carbon in the near surface region to create a silicon-rich region near the exposed surface of the silicon carbide regions. Volatile species which may be created during this reaction may include carbon dioxide ($CO_2$) which can then be pumped away through an exhaust system fluidly coupled to the substrate processing region. The silicon-rich near surface region of the silicon carbide can be etched by the radical-fluorine precursors which are concurrently available within the substrate processing region. The silicon oxide regions are essentially unaffected by the radical-oxygen. Radical-fluorine precursors are highly selective towards silicon and leave silicon oxide essentially unetched. As a consequence, the etching methods outlined herein achieve selectivity toward silicon-and-carbon-containing material. Blanket wafers of silicon oxide and silicon carbide were used to quantify the etch rates for an exemplary process. A remote plasma was formed from nitrogen trifluoride, oxygen ($O_2$), helium and argon and the effluents etched about four hundred angstroms of silicon carbide. The same process removed only a tenth of an angstrom (approximately) of silicon oxide on a separate blanket wafer. The selectivity for this experiment was in excess of a thousand (silicon carbide:silicon oxide). Generally speaking, the selectivity of the etching methods presented herein may possess selectivities (silicon-and-carbon-containing material: silicon oxide) greater than or about 20:1, greater than or about 100:1, greater than or about 500:1 or greater than or about 1000:1. The selectivity, the non-local plasma, the controlled ionic concentration and the lack of solid byproducts, each make these etch processes well suited for removing or trimming delicate silicon-and-carbon-containing material structures with little deformation and while removing little or no silicon oxide. These selectivities also apply generally to silicon-and-carbon-containing material which will be described shortly.

The temperature of the substrate may be between about −30° C. and about 150° C. in general. The etch rate has been found to be higher for the lower temperatures within this range. In embodiments, the temperature of the substrate during the etches described herein may be about 0° C. or more, about 5° C. or more or about 10° C. or more. The substrate temperatures may be less than or about 50° C., less than or about 30° C., less than or about 20° C., less than or about 15° C. or less than or about 10° C. in different embodiments. The data further show an increase in etch rate as a function of process pressure. The pressure within the substrate processing region is below or about 50 Torr, below or about 30 Torr, below or about 20 Torr, below or about 10 Torr or below or about 5 Torr. The pressure may be above or about 0.1 Torr, above or about 0.2 Torr, above or about 0.5 Torr or above or about 1 Torr in embodiments of the invention. Any of the upper limits on temperature or pressure may be combined with lower limits to form additional embodiments. Generally speaking, the processes described herein may be used to etch films which contain silicon and carbon (and not just silicon carbide). The remote plasma etch processes may remove silicon-and-carbon-containing material which includes an atomic concentration of about 30% or more silicon and about 30% or more carbon in embodiments of the invention. The silicon-and-carbon-containing material may also consist essentially of silicon and carbon, allowing for small dopant concentrations and other undesirable or desirable minority additives. Of course, the silicon-and-carbon-containing material may consist essentially of silicon carbide in embodiments of the invention.

Additional process parameters are disclosed in the course of describing an exemplary processing chamber and system.

Exemplary Processing System

Processing chambers that may implement embodiments of the present invention may be included within processing platforms such as the CENTURA® and PRODUCER® systems, available from Applied Materials, Inc. of Santa Clara, Calif. Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 2A:
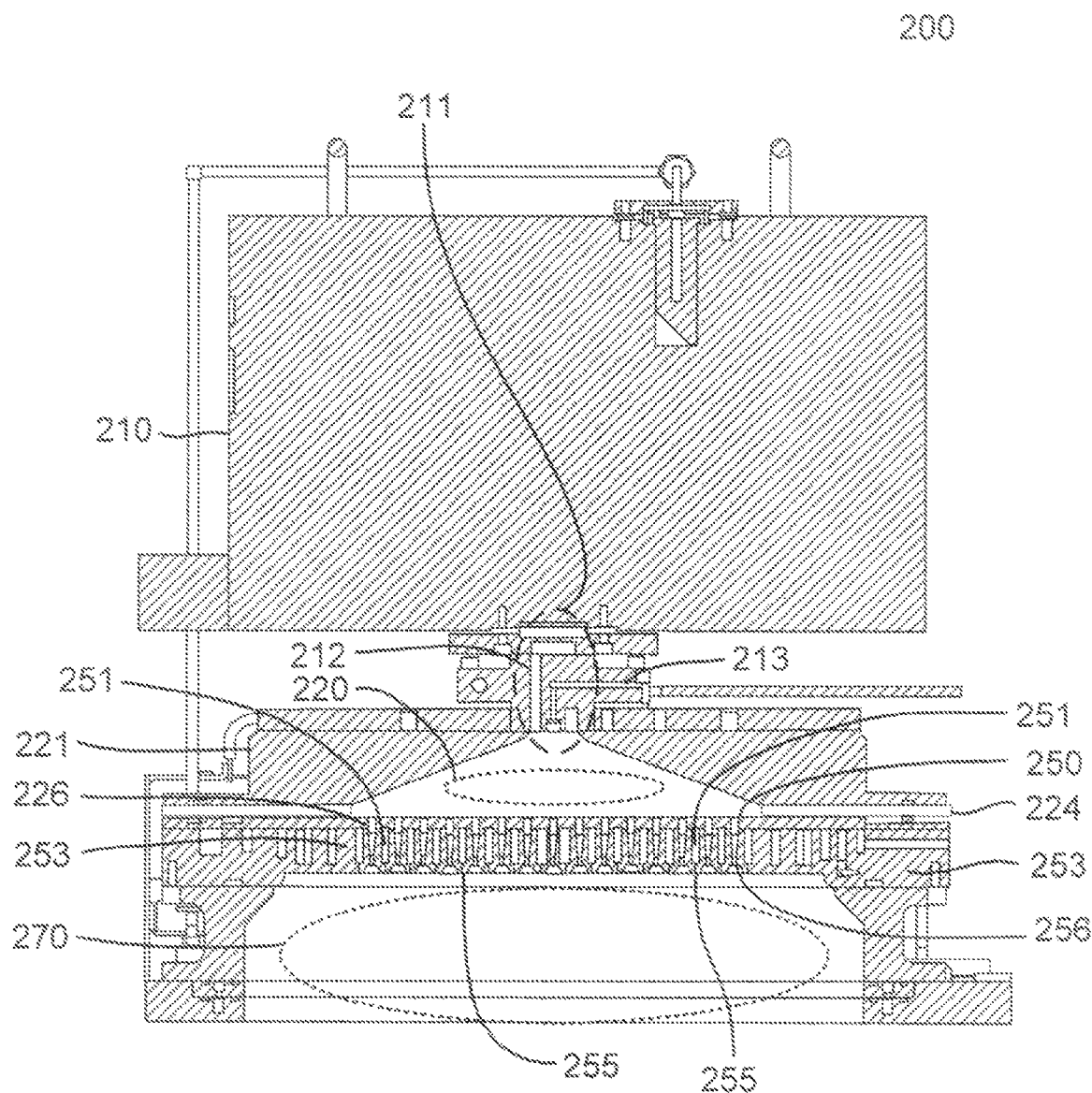
FIG. 2A shows a substrate processing chamber according to embodiments of the invention.

FIG. 2A is a substrate processing chamber 200 according to disclosed embodiments. A remote plasma system 210 may process the fluorine-containing precursor which then travels through a gas inlet assembly 211. Two distinct gas supply channels are visible within the gas inlet assembly 211. A first channel 212 carries a gas that passes through the remote plasma system 210 (RPS), while a second channel 213 bypasses the remote plasma system 210. Either channel may be used for the fluorine-containing precursor, in embodiments. On the other hand, the first channel 212 may be used for the process gas and the second channel 213 may be used for a treatment gas. The lid (or conductive top portion) 221 and a perforated partition 253 are shown with an insulating ring 224 in between, which allows an AC potential to be applied to the lid 221 relative to perforated partition 253. The AC potential strikes a plasma in chamber plasma region 220. The process gas may travel through first channel 212 into chamber plasma region 220 and may be excited by a plasma in chamber plasma region 220 alone or in combination with remote plasma system 210. If the process gas (the fluorine-containing precursor) flows through second channel 213, then only the chamber plasma region 220 is used for excitation. The combination of chamber plasma region 220 and/or remote plasma system 210 may be referred to as a remote plasma system herein. The perforated partition (also referred to as a showerhead) 253 separates chamber plasma region 220 from a substrate processing region 270 beneath showerhead 253. Showerhead 253 allows a plasma present in chamber plasma region 220 to avoid directly exciting gases in substrate processing region 270, while still allowing excited species to travel from chamber plasma region 220 into substrate processing region 270.

Showerhead 253 is positioned between chamber plasma region 220 and substrate processing region 270 and allows plasma effluents (excited derivatives of precursors or other gases) created within remote plasma system 210 and/or chamber plasma region 220 to pass through a plurality of through-holes 256 that traverse the thickness of the plate. The showerhead 253 also has one or more hollow volumes 251 which can be filled with a precursor in the form of a vapor or gas and pass through small holes 255 into substrate processing region 270 but not directly into chamber plasma region 220. Hollow volumes 251 may be used for precursors which do not require excitement by a plasma to achieve a specific process. Showerhead 253 is thicker than the length of the smallest diameter 250 of the through-holes 256 in this disclosed embodiment. In order to maintain a significant concentration of excited species penetrating from chamber plasma region 220 to substrate processing region 270, the length 226 of the smallest diameter 250 of the through-holes may be restricted by forming larger diameter portions of through-holes 256 part way through the showerhead 253. The length of the smallest diameter 250 of the through-holes 256 may be the same order of magnitude as the smallest diameter of the through-holes 256 or less in disclosed embodiments.

Showerhead 253 may be configured to serve the purpose of an ion suppressor as shown in FIG. 2A. Alternatively, a separate processing chamber element may be included (not shown) which suppresses the ion concentration traveling into substrate processing region 270. Lid 221 and showerhead 253 may function as a first electrode and second electrode, respectively, so that lid 221 and showerhead 253 may receive different electric voltages. In these configurations, electrical power (e.g., RF power) may be applied to lid 221, showerhead 253, or both. For example, electrical power may be applied to lid 221 while showerhead 253 (serving as ion suppressor) is grounded. The substrate processing system may include a RF generator that provides electrical power to the lid and/or showerhead 253. The voltage applied to lid 221 may facilitate a uniform distribution of plasma (i.e., reduce localized plasma) within chamber plasma region 220. To enable the formation of a plasma in chamber plasma region 220, insulating ring 224 may electrically insulate lid 221 from showerhead 253. Insulating ring 224 may be made from a ceramic and may have a high breakdown voltage to avoid sparking. Portions of substrate processing chamber 200 near the capacitively-coupled plasma components just described may further include a cooling unit (not shown) that includes one or more cooling fluid channels to cool surfaces exposed to the plasma with a circulating coolant (e.g., water).

In the embodiment shown, showerhead 253 may distribute (via through-holes 256) process gases which contain oxygen, fluorine and/or nitrogen and/or plasma effluents of such process gases upon excitation by a plasma in chamber plasma region 220. In embodiments, the process gas introduced into the remote plasma system 210 and/or chamber plasma region 220 may contain fluorine (e.g. $F_2$, $NF_3$ or $XeF_2$). The process gas may also include a carrier gas such as helium, argon, nitrogen ($N_2$), etc. Plasma effluents may include ionized or neutral derivatives of the process gas and may also be referred to herein as a radical-fluorine precursor referring to the atomic constituent of the process gas introduced.

Through-holes 256 are configured to suppress the migration of ionically-charged species out of the chamber plasma region 220 while allowing uncharged neutral or radical species to pass through showerhead 253 into substrate processing region 270. These uncharged species may include highly reactive species that are transported with less reactive carrier gas by through-holes 256. As noted above, the migration of ionic species by through-holes 256 may be reduced, and in some instances completely suppressed. Controlling the amount of ionic species passing through showerhead 253 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., $SiC_x$:$SiO_x$ etch ratios).

In embodiments, the number of through-holes 256 may be between about 60 and about 2000. Through-holes 256 may have a variety of shapes but are most easily made round. The smallest diameter 250 of through-holes 256 may be between about 0.5 mm and about 20 mm or between about 1 mm and about 6 mm in disclosed embodiments. There is also latitude in choosing the cross-sectional shape of through-holes, which may be made conical, cylindrical or combinations of the two shapes. The number of small holes 255 used to introduce unexcited precursors into substrate processing region 270 may be between about 100 and about 5000 or between about 500 and about 2000 in different embodiments. The diameter of the small holes 255 may be between about 0.1 mm and about 2 mm.

Through-holes 256 may be configured to control the passage of the plasma-activated gas (i.e., the ionic, radical, and/or neutral species) through showerhead 253. For example, the aspect ratio of the holes (i.e., the hole diameter to length) and/or the geometry of the holes may be controlled so that the flow of ionically-charged species in the activated gas passing through showerhead 253 is reduced. Through-holes 256 in showerhead 253 may include a tapered portion that faces chamber plasma region 220, and a cylindrical portion that faces substrate processing region 270. The cylindrical portion may be proportioned and dimensioned to control the flow of ionic species passing into substrate processing region 270. An adjustable electrical bias may also be applied to showerhead 253 as an additional means to control the flow of ionic species through showerhead 253.

Alternatively, through-holes 256 may have a smaller inner diameter (ID) toward the top surface of showerhead 253 and a larger ID toward the bottom surface. In addition, the bottom edge of through-holes 256 may be chamfered to help evenly distribute the plasma effluents in substrate processing region 270 as the plasma effluents exit the showerhead and thereby promote even distribution of the plasma effluents and precursor gases. The smaller ID may be placed at a variety of locations along through-holes 256 and still allow showerhead 253 to reduce the ion density within substrate processing region 270. The reduction in ion density results from an increase in the number of collisions with walls prior to entry into substrate processing region 270. Each collision increases the probability that an ion is neutralized by the acquisition or loss of an electron from the wall. Generally speaking, the smaller ID of through-holes 256 may be between about 0.2 mm and about 20 mm. In other embodiments, the smaller ID may be between about 1 mm and 6 mm or between about 0.2 mm and about 5 mm. Further, aspect ratios of the through-holes 256 (i.e., the smaller ID to hole length) may be approximately 1 to 20. The smaller ID of the through-holes may be the minimum ID found along the length of the through-holes. The cross sectional shape of through-holes 256 may be generally cylindrical, conical, or any combination thereof.

Figure 2B:
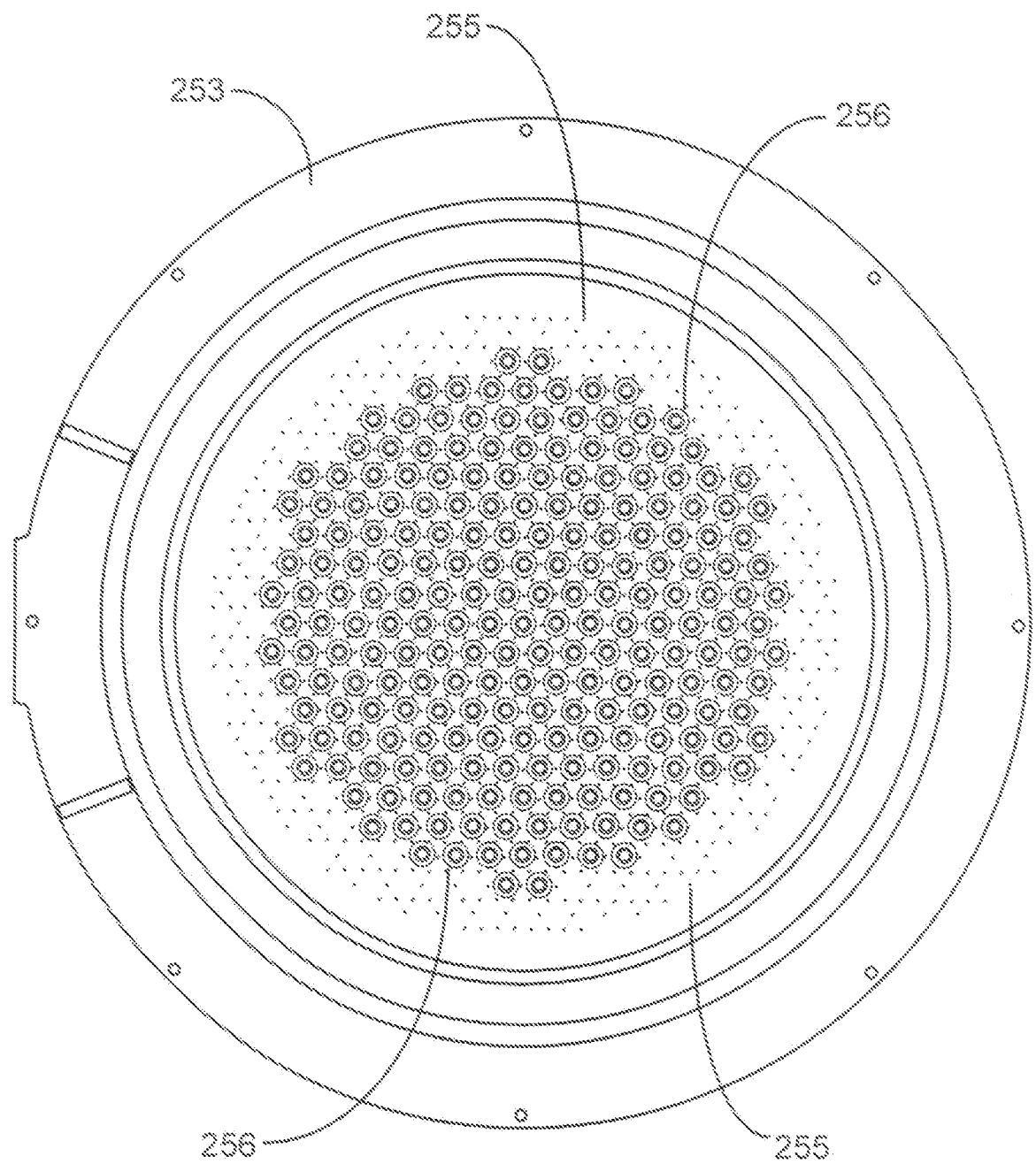
FIG. 2B shows a showerhead of a substrate processing chamber according to embodiments of the invention.

FIG. 2B is a bottom view of a showerhead 253 for use with a processing chamber according to disclosed embodiments. Showerhead 253 corresponds with the showerhead shown in FIG. 2A. Through-holes 256 are depicted with a larger inner-diameter (ID) on the bottom of showerhead 253 and a smaller ID at the top. Small holes 255 are distributed substantially evenly over the surface of the showerhead, even amongst the through-holes 256 which helps to provide more even mixing than other embodiments described herein.

An exemplary patterned substrate may be supported by a pedestal (not shown) within substrate processing region 270 when fluorine-containing plasma effluents and oxygen-containing plasma effluents arrive through through-holes 256 in showerhead 253. Though substrate processing region 270 may be equipped to support a plasma for other processes such as curing, no plasma is present during the etching of patterned substrate, in embodiments of the invention.

A plasma may be ignited either in chamber plasma region 220 above showerhead 253 or substrate processing region 270 below showerhead 253. A plasma is present in chamber plasma region 220 to produce the radical-fluorine precursors from an inflow of the fluorine-containing precursor. An AC voltage typically in the radio frequency (RF) range is applied between the conductive top portion (lid 221) of the processing chamber and showerhead 253 to ignite a plasma in chamber plasma region 220 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 270 is turned on to either cure a film or clean the interior surfaces bordering substrate processing region 270. A plasma in substrate processing region 270 is ignited by applying an AC voltage between showerhead 253 and the pedestal or bottom of the chamber. A cleaning gas may be introduced into substrate processing region 270 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the etching chamber. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may include a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

The chamber plasma region or a region in a remote plasma system may be referred to as a remote plasma region. In embodiments, the radical precursors (e.g. a radical-fluorine precursor and radical-oxygen precursor) are formed in the remote plasma region and travel into the substrate processing region where the combination preferentially etches siliconand-carbon-containing material. Plasma power may essentially be applied only to the remote plasma region, in embodiments, to ensure that the radical-fluorine precursor and the radical-oxygen precursor are not further excited in the substrate processing region.

In embodiments employing a chamber plasma region, the excited plasma effluents are generated in a section of the substrate processing region partitioned from a deposition region. The deposition region, also known herein as the substrate processing region, is where the plasma effluents mix and react to etch the patterned substrate (e.g., a semiconductor wafer). The excited plasma effluents may also be accompanied by inert gases (in the exemplary case, argon). The substrate processing region may be described herein as "plasma-free" during the etch of the patterned substrate. "Plasma-free" does not necessarily mean the region is devoid of plasma. A relatively low concentration of ionized species and free electrons created within the plasma region do travel through pores (apertures) in the partition (showerhead/ion suppressor) due to the shapes and sizes of through-holes 256. In some embodiments, there is essentially no concentration of ionized species and free electrons within the substrate processing region. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film. All causes for a plasma having much lower intensity ion density than the chamber plasma region (or a remote plasma region, for that matter) during the creation of the excited plasma effluents do not deviate from the scope of "plasma-free" as used herein.

Nitrogen trifluoride (or another fluorine-containing precursor) may be flowed into chamber plasma region 220 at rates between about 25 sccm and about 200 sccm, between about 50 sccm and about 150 sccm or between about 75 sccm and about 125 sccm in different embodiments. Oxygen ($O_2$) may be flowed into chamber plasma region 220 at rates between about 25 sccm and about 200 sccm, between about 50 sccm and about 150 sccm or between about 75 sccm and about 125 sccm in different embodiments.

Combined flow rates of fluorine-containing precursor and oxygen-containing precursor into the chamber may account for 0.05% to about 20% by volume of the overall gas mixture; the remainder being carrier gases. The fluorine-containing precursor and the oxygen-containing precursor are flowed into the remote plasma region but the plasma effluents have the same volumetric flow ratio, in embodiments. In the case of the fluorine-containing precursor, a purge or carrier gas may be first initiated into the remote plasma region before those of the fluorine-containing gas to stabilize the pressure within the remote plasma region.

Plasma power can be a variety of frequencies or a combination of multiple frequencies. In the exemplary processing system the plasma is provided by RF power delivered between lid 221 and showerhead 253. The RF power may be between about 10 Watts and about 2000 Watts, between about 20 Watts and about 1500 Watts or between about 50 Watts and about 500 Watts in different embodiments. The RF frequency applied in the exemplary processing system may be low RF frequencies less than about 200 kHz, high RF frequencies between about 10 MHz and about 15 MHz or microwave frequencies greater than or about 1 GHz in different embodiments.

Substrate processing region 270 can be maintained at a variety of pressures during the flow of carrier gases and plasma effluents into substrate processing region 270. The pressure within the substrate processing region is below or about 50 Torr, below or about 30 Torr, below or about 20 Torr, below or about 10 Torr or below or about 5 Torr. The pressure may be above or about 0.1 Torr, above or about 0.2 Torr, above or about 0.5 Torr or above or about 1 Torr in embodiments of the invention. Lower limits on the pressure may be combined with upper limits on the pressure to arrive at further embodiments of the invention.

In one or more embodiments, the substrate processing chamber 200 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum. Processing chambers that may implement embodiments of the present invention may include dielectric etch chambers or a variety of chemical vapor deposition chambers, among other types of chambers.

Figure 3:
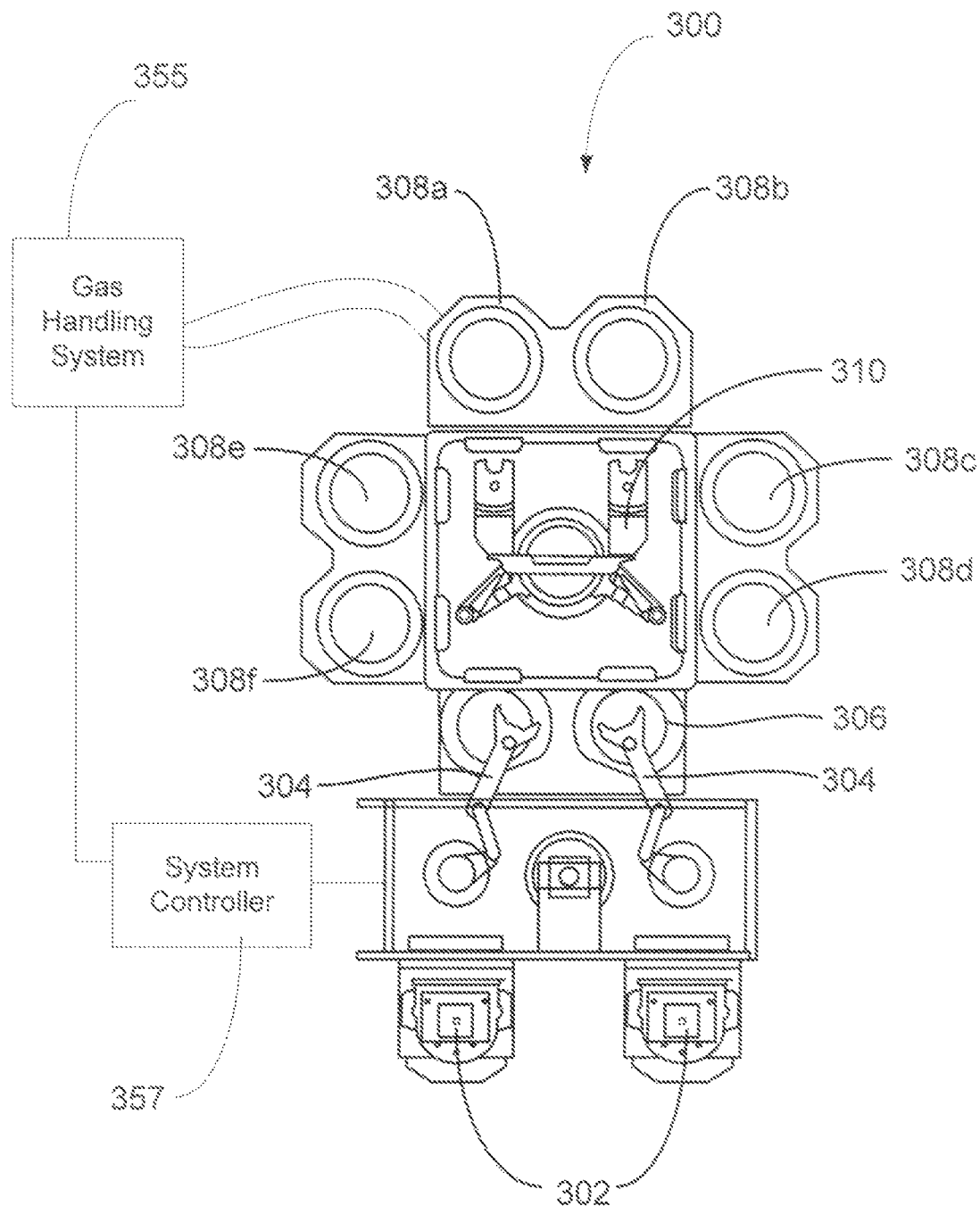
FIG. 3 shows a substrate processing system according to embodiments of the invention.

Embodiments of the deposition systems may be incorporated into larger fabrication systems for producing integrated circuit chips. FIG. 3 shows one such system 300 of deposition, baking and curing chambers according to disclosed embodiments. In the figure, a pair of FOUPs (front opening unified pods) 302 supply substrate substrates (e.g., 300 mm diameter wafers) that are received by robotic arms 304 and placed into a low pressure holding areas 306 before being placed into one of the wafer processing chambers 308a-f. A second robotic arm 310 may be used to transport the substrate wafers from the low pressure holding areas 306 to the wafer processing chambers 308a-f and back. Each wafer processing chamber 308a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The wafer processing chambers 308a-f may include one or more system components for depositing, annealing, curing and/or etching a flowable dielectric film on the substrate wafer. In one configuration, two pairs of the processing chamber (e.g., 308c-d and 308e-f) may be used to deposit dielectric material on the substrate, and the third pair of processing chambers (e.g., 308a-b) may be used to etch the deposited dielectric. In another configuration, all three pairs of chambers (e.g., 308a-f) may be configured to etch a dielectric film on the substrate. Any one or more of the processes described may be carried out on chamber(s) separated from the fabrication system shown in different embodiments.

System controller 357 is used to control motors, valves, flow controllers, power supplies and other functions required to carry out process recipes described herein. A gas handling system 355 may also be controlled by system controller 357 to introduce gases to one or all of the wafer processing chambers 308a-f. System controller 357 may rely on feedback from optical sensors to determine and adjust the position of movable mechanical assemblies in gas handling system 355 and/or in wafer processing chambers 308a-f. Mechanical assemblies may include the robot, throttle valves and susceptors which are moved by motors under the control of system controller 357.

In an exemplary embodiment, system controller 357 includes a hard disk drive (memory), USB ports, a floppy disk drive and a processor. System controller 357 includes analog and digital input/output boards, interface boards and stepper motor controller boards. Various parts of multi-chamber processing system 300 which contains substrate processing chamber 200 are controlled by system controller 357. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon oxide" of the patterned substrate is predominantly $SiO_2$ but may include concentrations of other elemental constituents such as nitrogen, hydrogen, carbon and the like. In some embodiments, silicon oxide films etched using the methods disclosed herein consist essentially of silicon and oxygen. The term "precursor" is used to refer to any process gas which takes part in a reaction to either remove material from or deposit material onto a surface. "Plasma effluents" describe gas exiting from the chamber plasma region and entering the substrate processing region. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate in a reaction to either remove material from or deposit material on a surface. A "radical-oxygen precursor" is a radical precursor which contains oxygen but may contain other elemental constituents. A "radical-fluorine precursor" is a radical precursor which contains fluorine but may contain other elemental constituents. "Radical-oxygen precursor" and "radical-fluorine precursor" are equivalent to "oxygen-containing plasma effluents" and "fluorine-containing plasma effluents," respectively. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching a patterned substrate in a substrate processing region of a substrate processing chamber, wherein the patterned substrate has an exposed silicon-and-carbon-containing region and an exposed silicon oxide region, the method comprising:

flowing each of a fluorine-containing precursor and an oxygen-containing precursor into a remote plasma region fluidly coupled to the substrate processing region while forming a plasma in the plasma region to produce plasma effluents; and etching the exposed silicon-and-carbon-containing region by flowing the plasma effluents into the substrate processing region through through-holes in a showerhead, wherein the selectivity of the etching operation (silicon-and-carbon-containing region: silicon oxide region) is greater than or about 100:1.

2. The method of claim 1 wherein the exposed silicon-and-carbon-containing region is silicon carbide.

3. The method of claim 1 wherein the exposed silicon-and-carbon-containing region consists essentially of silicon and carbon.

4. The method of claim 1 wherein the exposed silicon-and-carbon-containing region comprises about 30% or more silicon and about 30% or more carbon.

5. The method of claim 1 wherein a temperature of the patterned substrate is greater than or about 0° C. and less than or about 50° C.

6. The method of claim 1 wherein a pressure within the substrate processing region is below or about 50 Torr and above or about 0.1 Torr.

7. The method of claim 1 wherein forming a plasma in the plasma region to produce plasma effluents comprises applying RF power between about 10 Watts and about 2000 Watts to the plasma region.

8. The method of claim 1 wherein the plasma is a capacitively-coupled plasma.

9. The method of claim 1 wherein the oxygen-containing precursor comprises molecular oxygen ($O_2$).

10. The method of claim 1 wherein the oxygen-containing precursor comprises at least one of $O_2$, $O_3$, $N_2O$ or $NO_2$.

11. The method of claim 1 wherein the substrate processing region is plasma-free.

12. The method of claim 1 wherein the patterned substrate further comprises an exposed silicon oxide region and the selectivity of the etching operation (exposed silicon-and-carbon-containing region: exposed silicon oxide region) is greater than or about 20:1.

13. The method of claim 1 wherein the patterned substrate further comprises an exposed silicon oxide region and the selectivity of the etching operation (silicon-and-carbon-containing region: silicon oxide region) is greater than or about 500:1.

14. The method of claim 1 wherein the fluorine-containing precursor comprises $NF_3$.

15. The method of claim 1 wherein the fluorine-containing precursor comprises a precursor selected from the group consisting of atomic fluorine, diatomic fluorine, nitrogen trifluoride, carbon tetrafluoride and xenon difluoride.

16. The method of claim 1 wherein the fluorine-containing precursor and the plasma effluents are essentially devoid of hydrogen.

17. The method of claim 1 wherein there is essentially no concentration of ionized species and free electrons within the substrate processing region.

18. The method of claim 1 wherein the minimum ID of the through-holes in the showerhead is between about 0.2 mm and about 5 mm.

19. The method of claim 1 wherein flowing each of the fluorine-containing precursor and the oxygen-containing precursor into the remote plasma region comprises maintaining an O:F atomic flow ratio above or about 0.5:1 and below or about 10:1.

20. A method of etching a patterned substrate in a substrate processing region of a substrate processing chamber, wherein the patterned substrate has an exposed silicon-and-carbon-containing region and an exposed silicon oxide region, the method comprising:

flowing each of a fluorine-containing precursor and an oxygen-containing precursor into a remote plasma region fluidly coupled to the substrate processing region while forming a plasma in the plasma region to produce plasma effluents, wherein the fluorine-containing precursor comprises a precursor selected from the group consisting of atomic fluorine, diatomic fluorine, nitrogen trifluoride, carbon tetrafluoride and xenon difluoride, and wherein the fluorine-containing precursor and the plasma effluents are essentially devoid of hydrogen; and etching the exposed silicon-and-carbon-containing region, wherein the selectivity of the etching operation (silicon-and-carbon-containing region: silicon oxide region) is greater than or about 100:1.

* * * * *